United States Patent
Mase et al.

(10) Patent No.: US 11,054,522 B2
(45) Date of Patent: Jul. 6, 2021

(54) DISTANCE MEASURING DEVICE

(71) Applicant: HAMAMATSU PHOTONICS K.K., Hamamatsu (JP)

(72) Inventors: Mitsuhito Mase, Hamamatsu (JP); Jun Hiramitsu, Hamamatsu (JP); Akihiro Shimada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 250 days.

(21) Appl. No.: 15/316,935

(22) PCT Filed: May 28, 2015

(86) PCT No.: PCT/JP2015/065458
§ 371 (c)(1),
(2) Date: Dec. 7, 2016

(87) PCT Pub. No.: WO2015/190308
PCT Pub. Date: Dec. 17, 2015

(65) Prior Publication Data
US 2017/0115392 A1 Apr. 27, 2017

(30) Foreign Application Priority Data
Jun. 9, 2014 (JP) .............................. JP2014-118623

(51) Int. Cl.
*G01S 17/10* (2020.01)
*G01S 17/89* (2020.01)
(Continued)

(52) U.S. Cl.
CPC .............. *G01S 17/10* (2013.01); *G01S 7/487* (2013.01); *G01S 7/4816* (2013.01);
(Continued)

(58) Field of Classification Search
CPC ....................................................... G01C 3/08
(Continued)

(56) References Cited

U.S. PATENT DOCUMENTS 4,843,565 A * 6/1989 Rose ....................... G01S 11/12
250/559.38
8,139,116 B2 * 3/2012 Murayama ........ H01L 27/14837
348/135
(Continued)

FOREIGN PATENT DOCUMENTS

CN 101310522 11/2008
JP 2001-194458 A 7/2001
(Continued)

OTHER PUBLICATIONS

International Preliminary Report on Patentability dated Dec. 22, 2016 for PCT/JP2015/065458.

*Primary Examiner* — Yuqing Xiao
*Assistant Examiner* — Amir J Askarian
(74) *Attorney, Agent, or Firm* — Faegre Drinker Biddle & Reath LLP

(57) ABSTRACT

In accordance with an irradiation position of pulsed light, a selecting unit outputs a first transfer signal to a first transfer electrodes and outputs a second transfer signal to a second transfer electrodes, to allow signal charges to flow into first and second signal charge-collecting regions of a pixel corresponding to the irradiation position, and outputs a third transfer signal to a third transfer electrodes to allow unnecessary charges to flow into an unnecessary charge-discharging regions of a pixel other than the pixel corresponding to the irradiation position. An arithmetic unit reads out signals corresponding to respective quantities of signal charges collected in the first and second signal charge-collecting regions of the pixel selected by the selecting unit, and calculates a distance to an object based on a ratio between (Continued)

a quantity of signal charges collected in the first signal charge-collecting regions and a quantity of signal charges collected in the second signal charge-collecting regions.

2 Claims, 12 Drawing Sheets

(51) Int. Cl.
*H04N 5/369* (2011.01)
*H01L 27/146* (2006.01)
*G01S 7/481* (2006.01)
*G01S 7/487* (2006.01)
*G01S 17/42* (2006.01)
*G01S 7/4863* (2020.01)
*G01S 7/4865* (2020.01)

(52) U.S. Cl.
CPC .......... *G01S 7/4817* (2013.01); *G01S 7/4863* (2013.01); *G01S 7/4865* (2013.01); *G01S 17/42* (2013.01); *G01S 17/89* (2013.01); *H01L 27/14603* (2013.01); *H01L 27/14612* (2013.01); *H04N 5/369* (2013.01)

(58) Field of Classification Search
USPC .............................................. 356/3.01–5.15
See application file for complete search history.

(56) References Cited

U.S. PATENT DOCUMENTS

| | | | |
|---|---|---|---|
| 2006/0128087 A1* | 6/2006 | Bamji | G01S 7/4816 438/199 |
| 2009/0134396 A1 | 5/2009 | Kawahito et al. | |
| 2011/0037969 A1* | 2/2011 | Spickermann | G01S 7/4863 356/5.01 |
| 2012/0182540 A1* | 7/2012 | Suzuki | G01S 7/4814 356/4.01 |
| 2013/0120735 A1* | 5/2013 | Mase | G01S 7/4863 356/4.01 |
| 2013/0128259 A1* | 5/2013 | Mase | G01C 3/00 356/4.01 |
| 2015/0362586 A1* | 12/2015 | Heinrich | G01S 17/08 356/5.01 |
| 2018/0045816 A1* | 2/2018 | Jarosinski | G01S 7/4814 |

FOREIGN PATENT DOCUMENTS

| | | |
|---|---|---|
| JP | 2003-247809 A | 9/2003 |
| JP | 2008-122223 A | 5/2008 |
| JP | 2011-112385 A | 6/2011 |
| JP | 2012-083215 A | 4/2012 |
| JP | 2013-050310 A | 3/2013 |
| WO | WO-2007/026779 A1 | 3/2007 |
| WO | WO-2013/121267 A1 | 8/2013 |

* cited by examiner

*Fig.7*
(a) 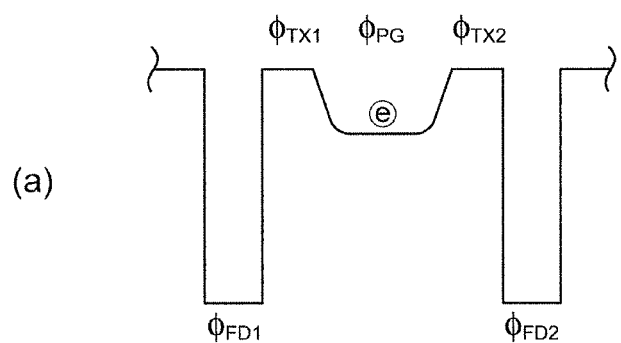
(b) 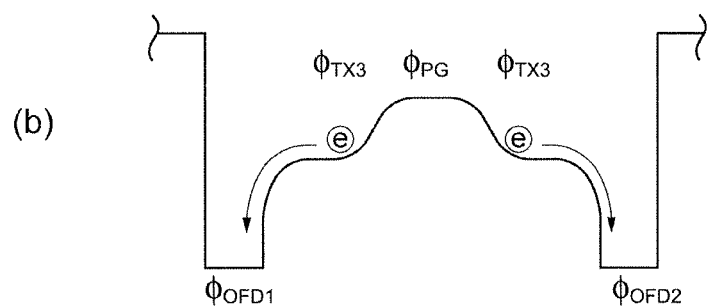

(a)

(b)

⇒ PIXEL INTO WHICH REFLECTED LIGHT IS INCIDENT

⇒ PIXEL FROM WHICH COMPONENT OF AMBIENT LIGHT IS OBTAINED

DISTANCE MEASURING DEVICE

TECHNICAL FIELD

The present invention relates to a ranging device.

BACKGROUND ART

Known ranging devices include a scanning unit scanning an irradiation position on an object of pulsed light emitted from a light source, a light receiving unit including a plurality of pixels arrayed in a one-dimensional direction, and into which reflected light of the pulsed light reflected off the object is incident, and an arithmetic unit reading out signals from the plurality of pixels and calculating a distance to the object (e.g., refer to Patent Literature 1). The ranging device described in Patent Literature 1 carries out Time-Of-Flight (TOF)-type ranging.

CITATION LIST

Patent Literature

Patent Literature 1: International Publication No. 2013/121267

SUMMARY OF INVENTION

Technical Problem

In the ranging device described in Patent Literature 1, a reset operation is carried out each time charges are accumulated, and unnecessary charges are discharged from pixels. This can prevent charges (unnecessary charges) generated in accordance with the incidence of ambient light, from being accumulated as signal charges, and prevent components of an ambient light from being reflected in the signal read out from the pixels.

Meanwhile, in order to enhance a ranging accuracy, a sufficient signal quantity is required to be ensured when the signals are read out from the pixels. In the ranging device described in Patent Literature 1, as described above, a reset operation is carried out each time charges are accumulated. It is therefore necessary to set a charge accumulation period in each pixel to a relatively long period, in order to ensure a sufficient signal quantity. A period of scanning carried out by the scanning unit also needs to be set to a long period in accordance with the charge accumulation period. Thus, in the ranging device described in Patent Literature 1, if the object moves, it may become difficult to appropriately measure the distance.

The object of the present invention is to provide a ranging device that can appropriately and accurately measure a distance.

Solution to Problem

A ranging device according to one aspect of the present invention includes a scanning unit scanning an irradiation position on an object of pulsed light emitted from a light source, a light receiving unit including a plurality of pixels arrayed in a one-dimensional direction, and into which reflected light of the pulsed light reflected off the object is incident, a selecting unit selecting, from the plurality of pixels, a pixel from which a signal is to be read out, in accordance with the irradiation position of the pulsed light scanned by the scanning unit, and an arithmetic unit reading out a signal from the pixel selected by the selecting unit, and calculating a distance to the object. Each of the plurality of pixels includes a charge-generating region generating charges in accordance with incident light, first and second signal charge-collecting regions disposed away from the charge-generating region, and collecting the charges generated in the charge-generating region, as signal charges, an unnecessary charge-discharging region disposed away from the charge-generating region, and discharging charges generated in the charge-generating region, as unnecessary charges, a first transfer electrode disposed between the first signal charge-collecting region and the charge-generating region, and allowing the charges generated in the charge-generating region to flow into the first signal charge-collecting region as the signal charges in accordance with a first transfer signal, a second transfer electrode disposed between the second signal charge-collecting region and the charge-generating region, and allowing charges generated in the charge-generating region to flow into the second signal charge-collecting region as signal charges in accordance with a second transfer signal different in phase from the first transfer signal, and a third transfer electrode disposed between the unnecessary charge-discharging region and the charge-generating region, and allowing the charges generated in the charge-generating region to flow into the unnecessary charge-discharging region as unnecessary charges in accordance with a third transfer signal different in phase from the first and second transfer signals. In accordance with an irradiation position of the pulsed light scanned by the scanning unit, the selecting unit outputs the first transfer signal to the first transfer electrode and outputs the second transfer signal to the second transfer electrode, to allow the signal charges to flow into the first and second signal charge-collecting regions of the pixel corresponding to the irradiation position, from among the plurality of pixels, and outputs the third transfer signal to the third transfer electrode to allow the unnecessary charges to flow into the unnecessary charge-discharging region of the pixel other than the pixel corresponding to the irradiation position, from among the plurality of pixels. The arithmetic unit reads out signals corresponding to respective quantities of the signal charges collected in the first and second signal charge-collecting regions of the pixel selected by the selecting unit, and calculates a distance to the object based on a ratio between the quantity of the signal charges collected in the first signal charge-collecting region and the quantity of the signal charges collected in the second signal charge-collecting region.

In the one aspect of the present invention, the selecting unit outputs the first transfer signal to the first transfer electrode of the pixel corresponding to the irradiation position of the pulsed light, to allow the signal charges to flow into the first signal charge-collecting region of the pixel. The selecting unit outputs the second transfer signal different in phase from the first transfer signal, to the second transfer electrode of the above-described pixel corresponding to the irradiation position of the pulsed light, to allow the signal charges to flow into the second signal charge-collecting region of the pixel. In other words, the charges generated in the charge-generating region of the pixel selected by the selecting unit are distributed to the first signal charge-collecting region and the second signal charge-collecting region as the signal charges, and the signal charges are collected in the corresponding signal charge-collecting regions. The selecting unit outputs the third transfer signal to the third transfer electrode of the pixel other than the above-described pixel corresponding to the irradiation position of the pulsed light, to allow the unnecessary charges to flow into the unnecessary charge-discharging region of the pixel. In other words, in the pixel other than the pixel in which signal charges are collected, the charges generated in the charge-generating region of the pixel are discharged from the unnecessary charge-discharging region as unnecessary charges. The arithmetic unit reads out the signals corresponding to respective quantities of the signal charges collected in the first and second signal charge-collecting regions of the pixel selected by the selecting unit, and calculates the distance to the object based on the ratio between the quantity of the signal charges collected in the first signal charge-collecting region and the quantity of the signal charges collected in the second signal charge-collecting region. In view of these aspects, in the pixel other than the pixel in which signal charges are collected, charges generated in the charge-generating region of the pixel are discharged as unnecessary charges. Thus, a charge quantity that is based on unnecessary charges is difficult to be reflected in the calculation of the distance to the object. Therefore, ranging can be appropriately and accurately carried out.

In an embodiment, in the selected pixel, the selecting unit may output the first transfer signal to the first transfer, electrode and outputs the second transfer signal to the second transfer electrode, to allow charges to flow into the first and second signal charge-collecting region, at a timing different from a timing at which signal charges are caused to flow into the first and second signal charge-collecting regions, and at a timing at which the pulsed light is not emitted from the light source, and the arithmetic unit may calculate a distance to the object based on a ratio between a quantity of signal charges collected in the first signal charge-collecting region that is obtained by subtracting a quantity of charges collected in the first signal charge-collecting region at a timing at which the pulsed light is not emitted from the light source, and a quantity of signal charges collected in the second signal charge-collecting region that is obtained by subtracting a quantity of charges collected in the second signal charge-collecting region at a timing at which the pulsed light is not emitted from the light source.

According to the above-described embodiment, in the selected pixel, the selecting unit outputs the first transfer signal to allow the charges to flow into the first signal charge-collecting region, at the timing different from the timing at which the signal charges are caused to flow into the first and second signal charge-collecting regions, and at the timing at which the pulsed light is not emitted from the light source. In the above-described selected pixel, the selecting unit outputs the second transfer signal to allow the charges to flow into the second signal charge-collecting region, at the timing different from the timing at which the signal charges are caused to flow into the first and second signal charge-collecting regions, and at the timing at which the pulsed light is not emitted from the light source. In other words, in the charge-generating region of the pixel selected by the selecting unit, the charges generated not by the emission of the pulsed light corresponding to the pixel are distributed to the first signal charge-collecting region and the second signal charge-collecting region, and are collected in the corresponding regions. The arithmetic unit calculates the distance to the object based on the ratio between the quantity of the signal charges collected in the first signal charge-collecting region that is obtained by subtracting the quantity of the charges collected in the first signal charge-collecting region at the timing at which the pulsed light is not emitted from the light source, and the quantity of the signal charges collected in the second signal charge-collecting region that is obtained by subtracting the quantity of the charges collected in the second signal charge-collecting region at the timing at which the pulsed light is not emitted from the light source. That is, by subtracting the charges generated not by the emission of the pulsed light corresponding to the selected pixel, the charge quantity that is based on ambient light such as background light is difficult to be reflected in the calculation of the distance to the object. Therefore, ranging can be carried out more appropriately and accurately.

Advantageous Effects of Invention

According to the above-described one aspect of the present invention, a ranging device that can appropriately and accurately measure a distance can be provided.

BRIEF DESCRIPTION OF DRAWINGS

FIG. 7 is a diagram illustrating a potential profile in the vicinity of the second principal surface of the semiconductor substrate.

DESCRIPTION OF EMBODIMENTS

Hereinafter, an embodiment of the present invention will be described in detail with reference to the drawings. In the description, the same elements or elements with the same functionality will be denoted by the same reference signs, without redundant description.

Figure 1:
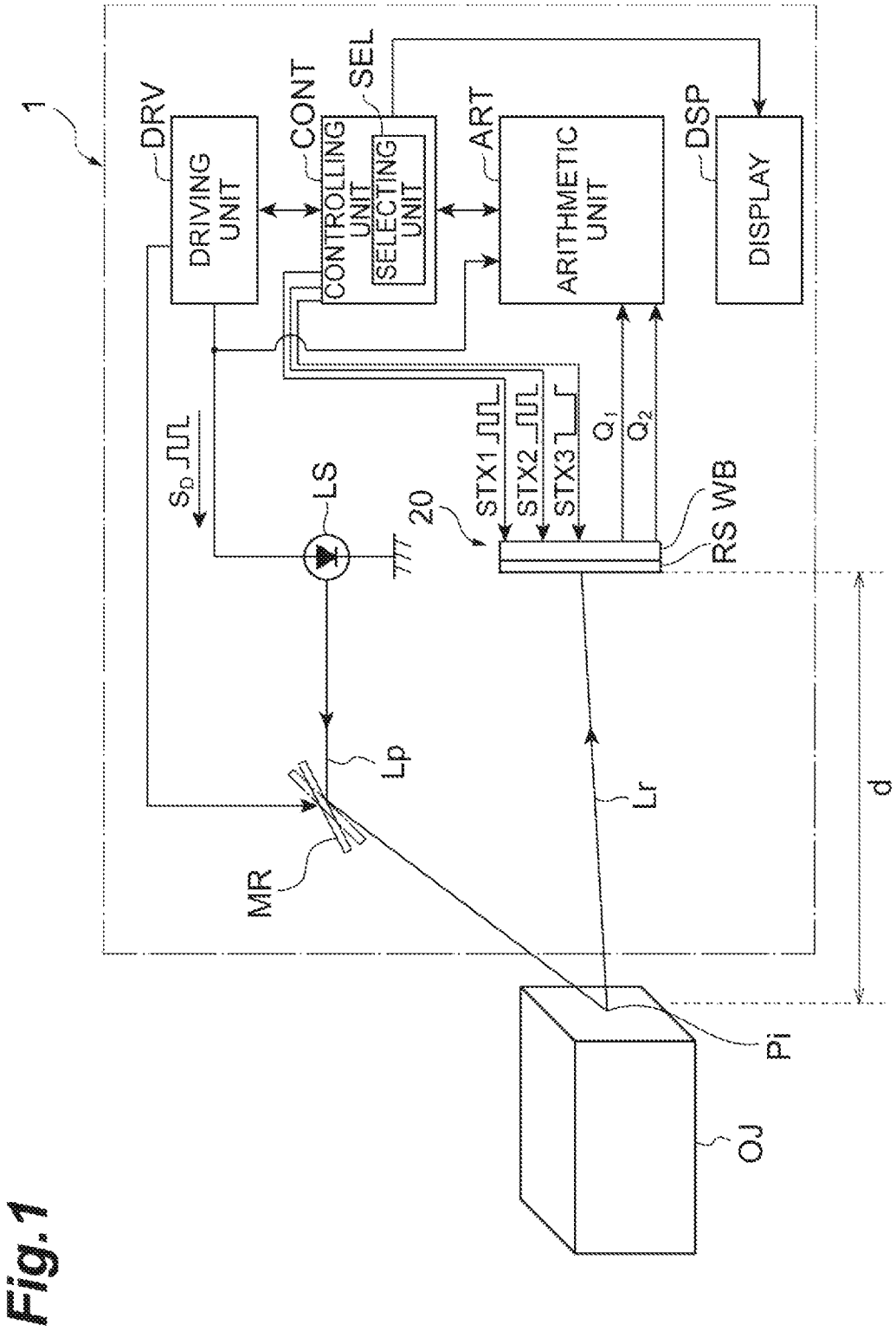
FIG. 1 is an explanatory diagram illustrating a configuration of a ranging device according to an embodiment of the present invention.

FIG. 1 is an explanatory diagram illustrating a configuration of a ranging device according to the present embodiment.

A ranging device 1 is a device measuring a distance d to an object OJ. The ranging device 1 includes a range image sensor RS including a plurality of pixels, a light source LS, a reflection member MR, a display DSP, and a control unit. The control unit includes a driving unit DRV, a controlling unit CONT, and an arithmetic unit ART. The light source LS emits pulsed light Lp toward the reflection member MR. The light source LS includes by, for example, a laser light irradiation device or an LED. The range image sensor RS is a TOF-type range image sensor. The range image sensor RS is disposed on a wiring board WB.

The control unit (the driving unit DRV, the controlling unit CONT, and the arithmetic unit ART) includes a hardware including an arithmetic circuit such as a central processing unit (CPU), a memory such as a random access memory (RAM) and a read only memory (ROM), a power circuit, and a readout circuit including an A/D converter. The whole or a part of the control unit may be constituted by an integrated circuit such as an application specific integrated circuit (ASIC) or a field programmable gate array (FPGA).

The driving unit DRV applies a drive signal $S_D$ to the light source LS in accordance with a control of the controlling unit CONT. More specifically, the driving unit DRV drives the light source LS to emit the pulsed light Lp toward the reflection member MR per frame period. The driving unit DRV applies a drive signal to an actuator of the reflection member MR in accordance with the control of the controlling unit CONT. That is, the driving unit DRV drives the actuator to change a light path of the pulsed light Lp emitted from the light source LS toward the reflection member MR. The reflection member MR reflects the pulsed light Lp emitted from the light source LS. The reflected pulsed light Lp is irradiated onto the object OJ. The actuator deflects an angle of the reflection member MR in accordance with the drive signal from the driving unit DRV. As a result, an irradiation position Pi on the object OJ of the pulsed light Lp emitted from the light source LS is scanned. In the present embodiment, the driving unit DRV and the reflection member MR function as a scanning unit scanning the irradiation position on the object OJ of the pulsed light Lp emitted from the light source LS. The reflection member MR is a micro electro mechanical systems (MEMS) mirror, for example.

The controlling unit CONT controls the driving unit DRV, and outputs first to third transfer signals STX1, STX2, and STX3 to the range image sensor RS. The controlling unit CONT displays a arithmetic result of the arithmetic unit ART on the display DSP. The controlling unit CONT includes a selecting unit SEL. The selecting unit SEL selects a pixel from which a signal is to be read out, from the plurality of pixels included in the range image sensor RS, in accordance with the irradiation position on the object OJ of the pulsed light Lp. The arithmetic unit ART reads out charge quantities $Q_1$ and $Q_2$ (total charge quantities $Q_{T1}$ and $Q_{T2}$) of signal charges from the pixel selected by the selecting unit SEL. Based on the read out charge quantities $Q_1$ and $Q_2$ (total charge quantities $Q_{T1}$ and $Q_{T2}$), the arithmetic unit ART calculates the distance d for each pixel, and outputs the obtained arithmetic result to the controlling unit CONT. The calculation method of the distance d will be described in detail later with reference to FIG. 8. The display DSP displays the arithmetic result of the arithmetic unit ART input from the controlling unit CONT.

In the ranging device 1, by applying the drive signal $S_D$ to the light source LS, the pulsed light Lp is emitted from the light source LS per frame period. The pulsed light Lp emitted from the light source LS is scanned by the reflection member MR. The pulsed light Lp that has been incident onto the object OJ is reflected by the object OJ. Thus, the pulsed light Lp that has been incident onto the object OJ is emitted from the object OJ as reflected light Lr. The reflected light Lr emitted from the object OJ is incident into a charge-generating region of the range image sensor RS.

The charge quantities $Q_1$ and $Q_2$ (total charge quantities $Q_{T1}$ and $Q_{T2}$) collected in synchronization with the first and second transfer signals STX1 and STX2 are output for each pixel from the range image sensor RS. The output charge quantities $Q_1$ and $Q_2$ (total charge quantities $Q_{T1}$ and $Q_{T2}$) are input to the arithmetic unit ART in synchronization with the drive signal $S_D$. Based on the input charge quantities $Q_1$ and $Q_2$ (total charge quantities $Q_{T1}$ and $Q_{T2}$), the arithmetic unit ART calculates the distance d for each pixel. The controlling unit CONT obtains the arithmetic result of the arithmetic unit ART from the arithmetic unit ART. The controlling unit CONT transfers the input arithmetic result of the arithmetic unit ART to the display DSP. The display DSP displays the arithmetic result of the arithmetic unit ART.

Figure 2:
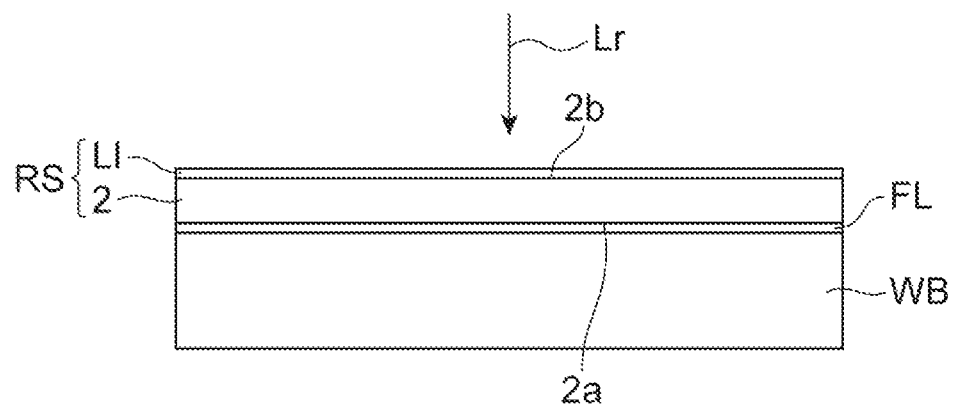
FIG. 2 is a diagram for illustrating a cross-sectional configuration of a range image sensor.

FIG. 2 is a diagram for illustrating a cross-sectional configuration of the range image sensor.

The range image sensor RS is a front-illuminated range image sensor, and includes a semiconductor substrate 2. The semiconductor substrate 2 has first and second principal surfaces 2a and 2b opposing each other. The second principal surface 2b is a light incident surface. The range image sensor RS is attached to the wiring board WB through an adhesive region FL in a state where the first principal surface 2a side of the semiconductor substrate 2 is opposing the wiring board WB. The adhesive region FL includes an insulated adhesive or a filler. The reflected light Lr is incident into the range image sensor RS from the second principal surface 2b side of the semiconductor substrate 2.

Figure 3:
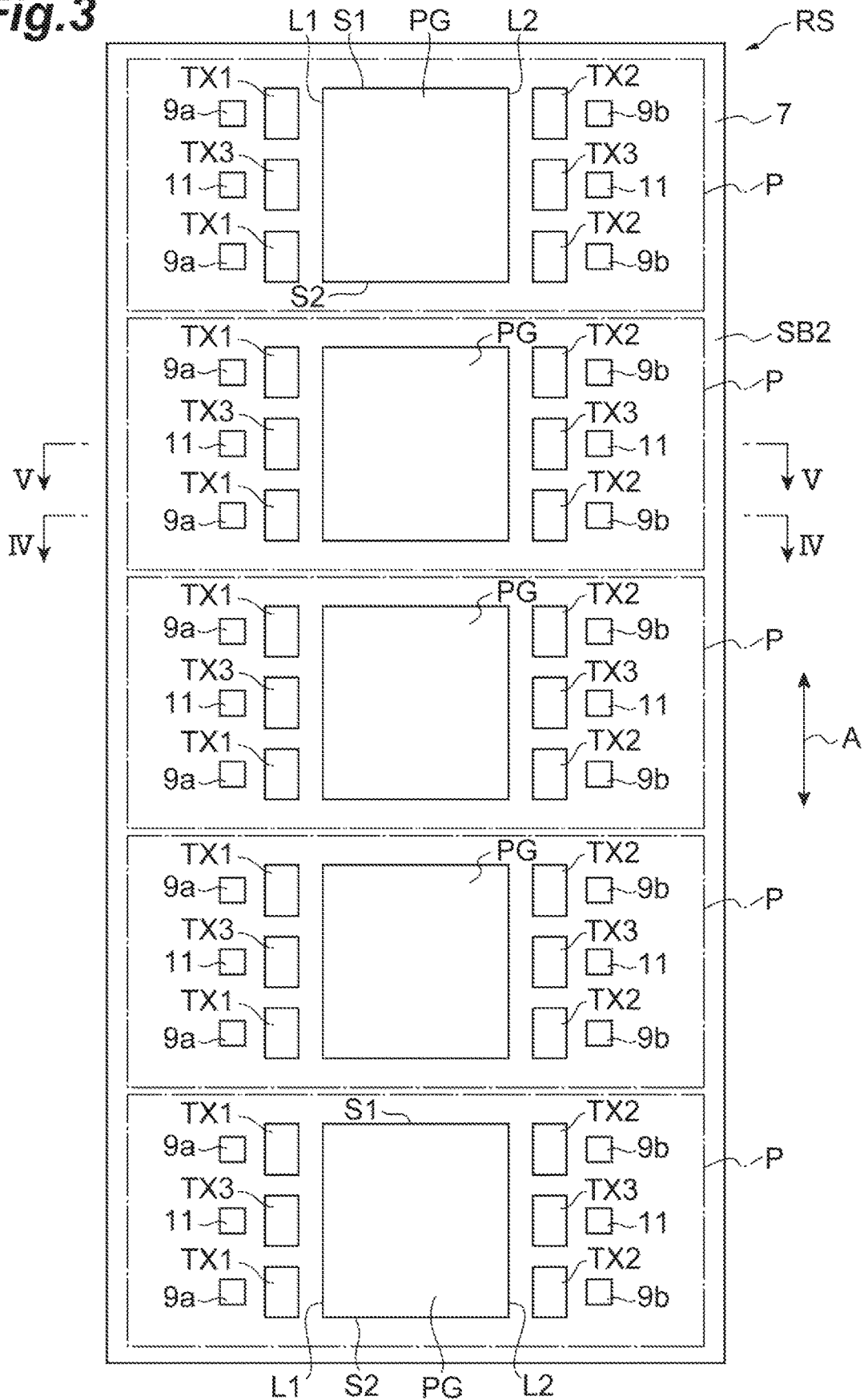
FIG. 3 is a configuration diagram of the range image sensor.
Figure 4:
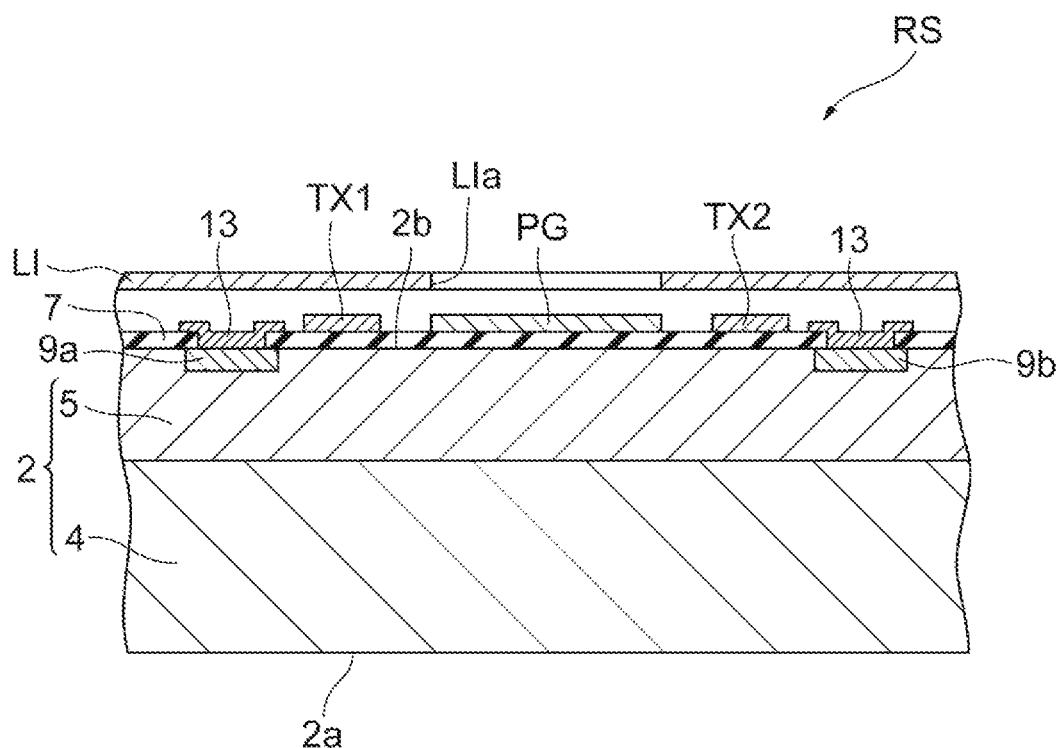
FIG. 4 is a diagram illustrating a configuration of a cross section taken along a line Iv-Iv illustrated in FIG. 3.
Figure 5:
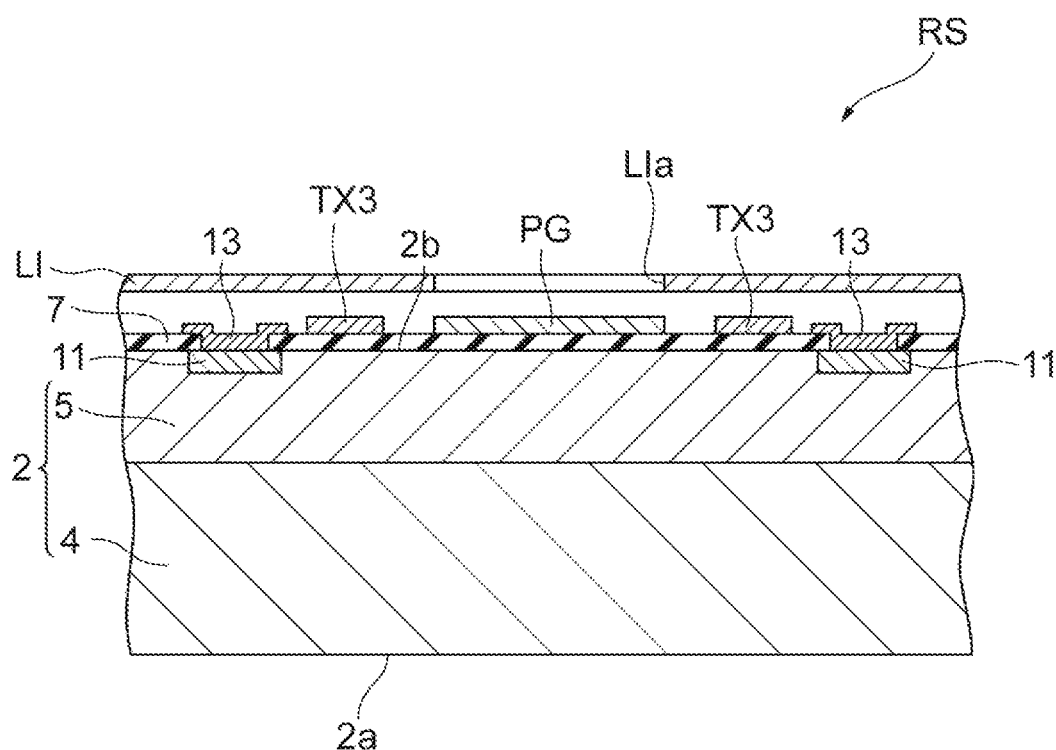
FIG. 5 is a diagram illustrating a configuration of a cross section taken along a line V-V illustrated in FIG. 3.

Subsequently, the range image sensor RS will be described in detail with reference to FIGS. 3 to 5. FIG. 3 is a configuration diagram of the range image sensor. FIG. 4 is a diagram illustrating a configuration of a cross section taken along a line IV-IV illustrated in FIG. 3. FIG. 5 is a diagram illustrating a configuration of a cross section taken along a line V-V illustrated in FIG. 3.

As illustrated in FIG. 3, the range image sensor RS is a line sensor with an array structure in which a plurality of range sensors (five range sensors in the present embodiment) P is disposed in a one-dimensional direction A. One, or two or more sensors of the plurality of range sensors P constitute one pixel (channel: ch) of the range image sensor RS. In the present embodiment, each of the range sensors P constitutes one pixel of the range image sensor RS. In the present embodiment, the range image sensor RS functions as a light receiving unit including a plurality of pixels arrayed in a one-dimensional direction, and into which the reflected light Lr of the pulsed light reflected by the object OJ is incident.

The range image sensor RS includes a light interception layer LI in front of the second principal surface 2b which is a light incident surface. A plurality of apertures LIa is formed in the light interception layer LI in the one-dimensional direction A. The plurality of apertures LIa is formed in regions corresponding to the plurality of range sensors P. The apertures LIa have a rectangular shape. In the present embodiment, the apertures LIa have an oblong shape. Light passes through the apertures LIa of the light interception layer LI, and is incident into the semiconductor substrate 2. Thus, a light receiving region on the semiconductor substrate 2 is defined by the aperture LIa. The light interception layer LI is made of metal such as aluminum, for example. In addition, in FIG. 3, the illustration of the light interception layer LI is omitted.

The semiconductor substrate 2 includes a p-type first semiconductor region 4 positioned on the first principal surface 2a side, and a p$^-$-type second semiconductor region 5 having lower impurity concentration than that of the first semiconductor region 4 and positioned on the second principal surface 2b side. For example, the semiconductor substrate 2 can be obtained by growing, on a p-type semiconductor substrate, a p$^-$-type epitaxial layer having lower impurity concentration than that of the p-type semiconductor substrate. An insulation layer 7 is formed on the second principal surface 2b of the semiconductor substrate 2 (the second semiconductor region 5). The plurality of range sensors P is disposed on the semiconductor substrate 2 in the one-dimensional direction A. That is, the plurality of range sensors P is positioned on the semiconductor substrate 2 to be aligned along the one-dimensional direction A.

As illustrated in FIGS. 3 to 5, each of the range sensors P includes a photogate electrode PG, a pair of first signal charge-collecting regions 9a, a pair of second signal charge-collecting regions 9b, a pair of unnecessary charge-discharging regions 11, and pairs of first to third transfer electrodes TX1, TX2, and TX3. In FIG. 3, conductors 13 (refer to FIGS. 4 and 5) disposed on the first and second signal charge-collecting regions 9a and 9b, and the unnecessary charge-discharging regions 11 are omitted.

The photogate electrode PG is disposed corresponding to the aperture LIa. A region corresponding to the photogate electrode PG (a region located below the photogate electrode PG in FIGS. 4 and 5) in the semiconductor substrate 2 (the second semiconductor region 5) functions as a charge-generating region (a photosensitive region) that generates charges in accordance with incidence of the reflected light Lr of the pulsed light Lp reflected off the object OJ. The photogate electrode PG also corresponds to the shape of the aperture LIa, and has a rectangular shape in a plan view. In the present embodiment, the photogate electrode PG has an oblong shape similarly to the aperture LIa. That is, the photogate electrode PG has a planar shape having first and second long side-edges L1 and L2 being parallel to the one-dimensional direction A and opposing each other, and first and second short side-edges S1 and S2 being orthogonal to the one-dimensional direction A and opposing each other.

The pair of first signal charge-collecting regions 9a is disposed at a first long side-edge L1 side of the photogate electrode PG along the first long side-edge L1. The pair of first signal charge-collecting regions 9a is disposed away from the photogate electrode PG. The pair of second signal charge-collecting regions 9b is disposed at a second long side-edge L2 side of the photogate electrode PG along the second long side-edge L2. The pair of second signal charge-collecting regions 9b is disposed away from the photogate electrode PG. In each of the range sensors P, the first and second signal charge-collecting regions 9a and 9b are disposed away from the charge-generating region (the region located below the photogate electrode PG). The first signal charge-collecting regions 9a and the second signal charge-collecting regions 9b oppose each other to sandwich the photogate electrode PG in a direction in which the first and second long side-edges L1 and L2 oppose each other (a direction orthogonal to the one-dimensional direction A).

The first and second signal charge-collecting regions 9a and 9b are n-type semiconductor regions formed on the second semiconductor region 5 and having high impurity concentration. The first and second signal charge-collecting regions 9a and 9b collect the charges generated in the charge-generating region, as signal charges, and accumulates the collected charges. The first and second signal charge-collecting regions 9a and 9b have a rectangular shape in a plan view. In the present embodiment, the first and second signal charge-collecting regions 9a and 9b have a square shape in a plan view, and both have the same shape. The first and second signal charge-collecting regions 9a and 9b are floating diffusion regions.

The first transfer electrodes TX1 are disposed on the insulation layer 7 and between the photogate electrode PG and first signal charge-collecting regions 9a. The first transfer electrodes TX1 are disposed away from the first signal charge-collecting regions 9a and the photogate electrode PG. In accordance with the first transfer signal STX1, the first transfer electrodes TX1 allow the charges generated in the charge-generating region, to flow into the first signal charge-collecting regions 9a as the signal charges.

The second transfer electrodes TX2 are provided on the insulation layer 7 and between the photogate electrode PG and second signal charge-collecting regions 9b. The second transfer electrodes TX2 are disposed away from the second signal charge-collecting regions 9b and the photogate electrode PG. In accordance with the second transfer signal STX2, the second transfer electrodes TX2 allow the charges generated in the charge-generating region, to flow into the second signal charge-collecting regions 9b as the signal charges.

The first and second transfer electrodes TX1 and TX2 have a rectangular shape in a plan view. In the present embodiment, the first and second transfer electrodes TX1 and TX2 have an oblong shape having a long side-edge direction set to a direction in which the first and second short side-edges S1 and S2 of the photogate electrode PG oppose each other. Lengths in the long side-edge direction of the first and second transfer electrodes TX1 and TX2 are set to be the same.

At the first long side-edge L1 side of the photogate electrode PG the unnecessary charge-discharging region 11 is disposed away from the first signal charge-collecting regions 9a to be sandwiched by the pair of first signal charge-collecting regions 9a in the direction in which the first and second short side-edges S1 and S2 oppose each other (the one-dimensional direction A). At the second long side-edge L2 side of the photogate electrode PG, the unnecessary charge-discharging region 11 is disposed away from the second signal charge-collecting regions 9b to be sandwiched by the pair of second signal charge-collecting regions 9b in the direction in which the first and second short sides S1 and S2 oppose each other (the one-dimensional direction A). Each of the unnecessary charge-discharging regions 11 is disposed at a distance from the photogate electrode PG. Each of the unnecessary charge-discharging regions 11 is disposed away from the charge-generating region (the region located below the photogate electrode PG). The unnecessary charge-discharging regions 11 oppose each other to sandwich the photogate electrode PG in the direction in which the first and second long sides L1 and L2 oppose each other.

The unnecessary charge-discharging regions 11 are n-type semiconductor regions formed on the second semiconductor region 5 and having high impurity concentration. The unnecessary charge-discharging regions 11 discharge the charges generated in the charge-generating region, as unnecessary charges. The unnecessary charge-discharging regions 11 have a rectangular shape in a plan view. In the present embodiment, the unnecessary charge-discharging regions 11 have a square shape in a plan view. The unnecessary charge-discharging regions 11 are connected to, for example, a fixed potential Vdd.

Each of the third transfer electrodes TX3 is provided on the insulation layer 7 and between the photogate electrode PG and a corresponding one of the unnecessary charge-discharging regions 11. The third transfer electrodes TX3 are disposed away from the unnecessary charge-discharging regions 11 and the photogate electrode PG. In accordance with the third transfer signal STX3, the third transfer electrodes TX3 allow the charges generated in the charge-generating region, to flow into the unnecessary charge-discharging regions 11 as the unnecessary charges. The third transfer electrodes TX3 have a rectangular shape in a plan view. In the present embodiment, the third transfer electrodes TX3 have an oblong shape having a long side-edge direction set to the direction in which the first and second short sides S1 and S2 of the photogate electrode PG oppose each other. Lengths in the long side-edge direction of the third transfer electrodes TX3 are set to be the same as the lengths in the long side-edge direction of the first and second transfer electrodes TX1 and TX2.

The insulation layer 7 is provided with contact holes for exposing the surface of the second semiconductor region 5. The conductors 13 are disposed in the contact holes to connect the first and second signal charge-collecting regions 9a and 9b, and the unnecessary charge-discharging regions 11 to the outside.

In the present embodiment, the "high impurity concentration" means, for example, impurity concentration of about $1 \times 10^{17}$ cm$^{-3}$ or more, and is indicated by "+" added to a conductivity type. The "Low impurity concentration" means, for example, impurity concentration of about $10 \times 10^{15}$ cm$^{-3}$ or less, and is indicated by "−" added to a conductivity type.

An example of thickness/impurity concentration of each semiconductor region is as follows.

First semiconductor region 4: thickness 10 to 1000 μm/impurity concentration $1 \times 10^{12}$ to $10^{19}$ cm$^{-3}$ Second semiconductor region 5: thickness 1 to 50 μm/impurity concentration $1 \times 10^{12}$ to $10^{15}$ cm$^{-3}$ First and second signal charge-collecting regions 9a and 9b: thickness 0.1 to 1 μm/impurity concentration $1 \times 10^{18}$ to $10^{20}$ cm$^{-3}$ unnecessary charge-discharging regions 11: thickness 0.1 to 1 μm/impurity concentration $1 \times 10^{18}$ to $10^{20}$ cm$^{-3}$ A reference potential such as a ground potential is supplied to the semiconductor substrate 2 (the first and second semiconductor regions 4 and 5) through a back gate, a through-via electrode, or the like. The semiconductor substrate is made of Si, the insulation layer 7 is made of SiO$_2$, and the photogate electrode PG and the first to third transfer electrodes TX1, TX2, and TX3 are made of polysilicon, but they may be made of other materials.

The phase of the first transfer signal STX1 applied to the first transfer electrodes TX1 and the phase of the second transfer signal STX2 applied to the second transfer electrodes TX2 differ in phase from each other. In the present embodiment, the phase of the first transfer signal STX1 and the phase of the second transfer signal STX2 are shifted by, for example, 180 degrees. The phase of the third transfer signal STX3 applied to the third transfer electrodes TX3 differs from the phases of the first and second transfer signals STX1 and STX2. In the present embodiment, the phase of the third transfer signal STX3 is reverse of the phases of the first and second transfer signals STX1 and STX2. That is, the third transfer signal STX3 is low when the first or second transfer signal STX1 or STX2 is high, and the third transfer signal STX3 is high when the first or second transfer signal STX1 or STX2 is low.

The light incident in each range sensor P is converted into charges in the semiconductor substrate 2 (the second semiconductor region 5). A part of the generated charges moves, as the signal charges, in a direction of the first transfer electrodes TX1 or the second transfer electrodes TX2, i.e., in a direction parallel to the first and second short side-edges S1 and S2 of the photogate electrode PG, in accordance with a potential gradient formed by voltage applied to the photogate electrode PG and the first and second transfer electrodes TX1 and TX2.

When a positive potential is supplied to the first or second transfer electrodes TX1 or TX2, a potential below the first or second transfer electrodes TX1 or TX2 becomes lower than a potential in a portion of the semiconductor substrate 2 (the second semiconductor region 5) that is below the photogate electrode PG with respect to electrons. Thus, negative charges (electrons) are drawn toward the direction of the first or second transfer electrodes TX1 or TX2, and collected into and accumulated in a potential well formed by the first and second signal charge-collecting regions 9a and 9b. An n-type semiconductor contains a positively-ionized donor and has a positive potential to attract electrons. When a potential (e.g., ground potential) lower than the above-described positive potential is supplied to the first or second transfer electrodes TX1 or TX2, a potential barrier is generated by the first or second transfer electrodes TX1 or TX2. Thus, the charges generated on the semiconductor substrate 2 are not drawn to the first and second signal charge-collecting regions 9a and 9b.

A part of the charges generated by light incident in each range sensor P moves as the unnecessary charges in the direction of the third transfer electrodes TX3, in accordance with a potential gradient formed by voltage applied to the photogate electrode PG and the third transfer electrodes TX3.

When a positive potential is supplied to the third transfer electrodes TX3, a potential below the third transfer electrodes TX3 becomes lower than the potential in the portion of the semiconductor substrate 2 (the second semiconductor region 5) that is below the photogate electrode PG. Thus, negative charges (electrons) are drawn toward the direction of the third transfer electrodes TX3, and collected into a potential well formed by the unnecessary charge-discharging regions 11, and then, discharged. When a potential (e.g., ground potential) lower than the above-described positive potential is given to the third transfer electrodes TX3, a potential barrier is generated by the third transfer electrodes TX3, and the charges generated on the semiconductor substrate 2 are not drawn to the unnecessary charge-discharging regions 11.

Figure 6:
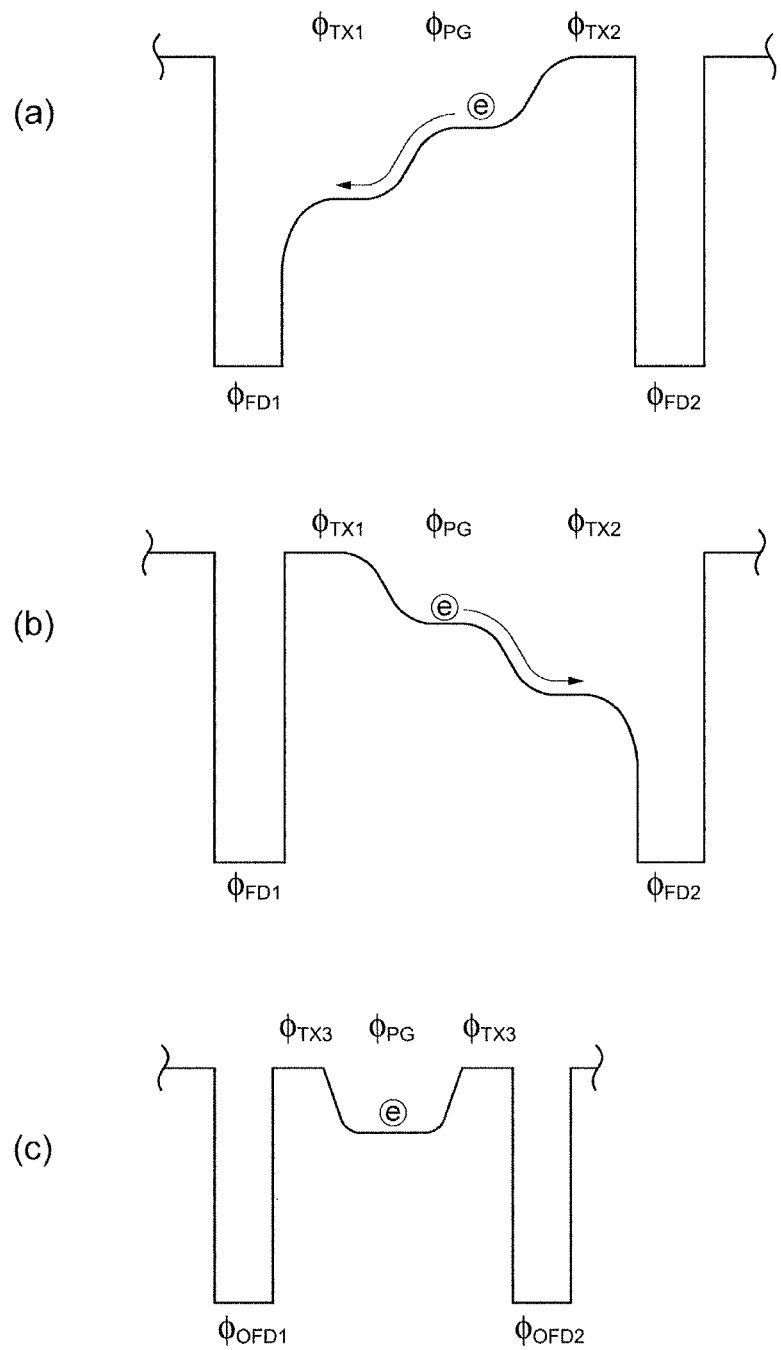
FIG. 6 is a diagram illustrating a potential profile in the vicinity of a second principal surface of a semiconductor substrate.

FIGS. 6 and 7 are diagrams each illustrating a potential profile in the vicinity of the second principal surface of the semiconductor substrate. FIG. 6 is a diagram for illustrating a collection operation (an accumulation operation) of the signal charges. FIG. 7 is a diagram for illustrating a discharge operation of the unnecessary charges. FIGS. 6(a), 6(b), and 7(a) illustrate potential profiles in the vicinity of the second principal surface 2b of the semiconductor substrate 2, taken along the line IV-IV illustrated in FIG. 3. FIGS. 6(c) and 7(b) illustrate potential profiles in the vicinity of the second principal surface 2b of the semiconductor substrate 2, taken along the line V-V illustrated in FIG. 3.

FIGS. 6 and 7 illustrate a potential $\varphi_{TX1}$ in a region immediately below the first transfer electrodes TX1, a potential $\varphi_{TX2}$ in a region immediately below the second transfer electrodes TX2, a potential $\varphi_{TX3}$ in a region immediately below the third transfer electrodes TX3, a potential $\varphi_{PG}$ in a charge-generating region immediately below the photogate electrode PG a potential $\varphi_{FD1}$ in the first signal charge-collecting regions 9a, a potential $\varphi_{FD2}$ in the second signal charge-collecting regions 9b, and potentials $\varphi_{OFD1}$ and $\varphi_{OFD2}$ in the unnecessary charge-discharging regions 11. In FIGS. 6 and 7, a downward direction corresponds to a positive direction of potentials.

When the potentials $\varphi_{TX1}$, $\varphi_{TX2}$, and $\varphi_{TX3}$ in the regions immediately below the adjacent first to third transfer electrodes TX1 to TX3 with no bias defined as reference potentials, the potential $\varphi_{PG}$ in the region (charge-generating region) immediately below the photogate electrode PG is set to be higher than the reference potentials. That is, when light is incident, the potential $\varphi_{PG}$ in the region immediately below the photogate electrode PG is set to be slightly higher than a substrate potential due to a potential supplied to the photogate electrode PG (e.g., an intermediate potential between a higher potential and a lower potential supplied to the first transfer electrodes TX1). The potential $\varphi_{PG}$ in the charge-generating region is higher than the potentials $\varphi_{TX1}$, $\varphi_{TX2}$, and $\varphi_{TX3}$. The potential profile has a shape recessed downward of the drawings in the charge-generating region.

The collection operation (accumulation operation) of the signal charges will be described with reference to FIG. 6.

When the phase of the first transfer signal STX1 applied to the first transfer electrodes TX1 is 0 degree, a positive potential is supplied to the first transfer electrodes TX1. A inverse phase potential, i.e., a potential at a phase of 180 degrees (e.g., ground potential) is supplied to the second transfer electrodes TX2. An intermediate potential between the potential supplied to the first transfer electrodes TX1 and the potential supplied to the second transfer electrodes TX2 is supplied to the photogate electrode PG. In this case, as illustrated in FIG. 6(a), the potential $\varphi_{TX1}$ in the semiconductor immediately below the first transfer electrodes TX1 becomes lower than the potential $\varphi_{PG}$ in the charge-generating region, and thus a negative charge e generated in the charge-generating region flows into the potential well of the first signal charge-collecting regions 9a.

The potential $\varphi_{Tx2}$ in the semiconductor region immediately below the second transfer electrodes TX2 does not become lower, and the charge does not flow into the potential well of the second signal charge-collecting regions 9b. Therefore, the signal charges are collected into and accumulated in the potential well of the first signal charge-collecting regions 9a. Since the first and second signal charge-collecting regions 9a and 9b are doped with n-type impurities, the potentials are recessed in the positive direction.

When the phase of the second transfer signal STX2 applied to the second transfer electrodes TX2 is 0 degree, a positive potential is supplied to the second transfer electrodes TX2, and a inverse phase potential, i.e., a potential at a phase of 180 degrees (e.g., ground potential) is supplied to the first transfer electrodes TX1. An intermediate potential between the potential supplied to the first transfer electrodes TX1 and the potential supplied to the second transfer electrodes TX2 is given to the photogate electrode PG. In this case, as illustrated in FIG. 6(b), the potential $\varphi_{TX2}$ in the semiconductor immediately below the second transfer electrodes TX2 becomes lower than the potential $\varphi_{PG}$ in the charge-generating region, and thus a negative charge e generated in the charge-generating region flows into the potential well of the second signal charge-collecting regions 9b.

The potential $\varphi_{TX1}$ of the semiconductor region immediately below the first transfer electrodes TX1 does not become lower, and the charge does not flow into the potential well of the first signal charge-collecting regions 9a. Therefore, the signal charges are collected into and accumulated in the potential well of the second signal charge-collecting regions 9b.

During the first and second transfer signals STX1 and STX2 having the phases shifted from each other by 180 degrees are applied to the first and second transfer electrodes TX1 and TX2, the ground potential is supplied to the third transfer electrodes TX3. Thus, as illustrated in FIG. 6(c), the potential $\varphi_{TX3}$ of the semiconductor immediately below the third transfer electrodes TX3 does not become lower, and the charge does not flow into the potential wells of the unnecessary charge-discharging regions 11.

In such manners, the signal charges are collected into and accumulated in the potential wells of the first and second signal charge-collecting regions 9a and 9b. The signal charges accumulated in the potential wells of the first and second signal charge-collecting regions 9a and 9b are read out to the outside.

The discharge operation of the unnecessary charges will be described with reference to FIG. 7.

The ground potential is supplied to the first and second transfer electrodes TX1 and TX2. Thus, as illustrated in FIG. 7(a), the potentials $\varphi_{TX1}$ and $\varphi_{TX2}$ in the semiconductor regions immediately below the first and second transfer electrodes TX1 and TX2 do not become lower, and the charge does not flow into the potential wells of the first and second signal charge-collecting regions 9a and 9b. A positive potential is supplied to the third transfer electrodes TX3. In this case, as illustrated in FIG. 7(b), the potential $\varphi_{TX3}$ in the semiconductor region immediately below the third transfer electrodes TX3 becomes lower than the potential $\varphi_{PG}$ in the charge-generating region, and thus a negative charge e generated in the charge-generating region flows into the potential wells of the unnecessary charge-discharging regions 11. In such manners, the unnecessary charges are collected into the potential wells of the unnecessary charge-discharging regions 11. The unnecessary charges collected into the potential wells of the unnecessary charge-discharging regions 11 are discharged to the outside.

Figure 8:
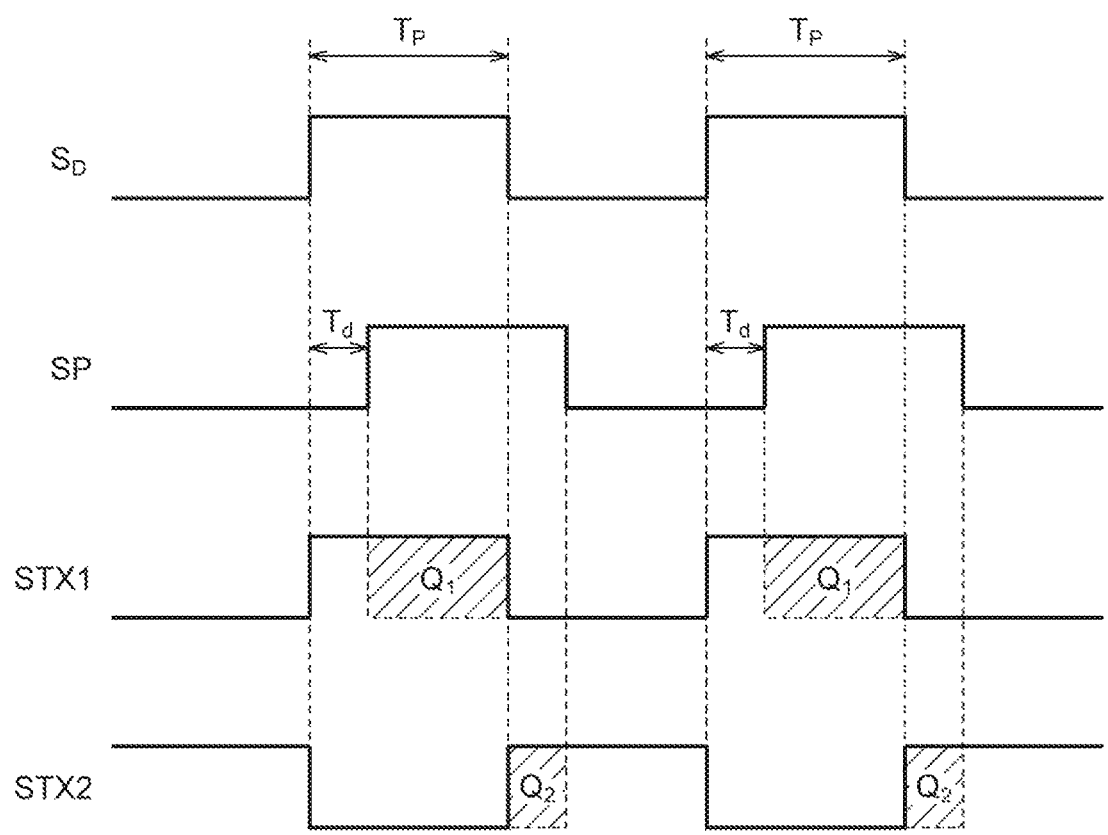
FIG. 8 is a timing chart of various signals.

A method for arithmetization of the distance d will now be described with reference to FIG. 8. FIG. 8 is a timing chart of various signals. FIG. 8 illustrates various signals in a period in which the signal charges are collected and accumulated (accumulation period). The frame period includes a period in which the signal charges are read out (readout period), in addition to the accumulation period.

FIG. 8 illustrates the drive signal $S_D$ of the light source, an intensity signal SP of the reflected light Lr that is obtainable when the reflected light Lr is incident into the range image sensor RS, the first transfer signal STX1 applied to the first transfer electrodes TX1, and the second transfer signal STX2 applied to the second transfer electrodes TX2. All of the drive signal $S_D$, the intensity signal SP, the first transfer signal STX1, and the second transfer signal STX2 are pulse signals each having a pulse width $T_p$.

In the accumulation period, upon the drive signal $S_D$ being applied to the light source LS, in synchronization with the application of the drive signal $S_D$, the first and second transfer signals STX1 and STX2 are applied to the first and second transfer electrodes TX1 and TX2 at phases opposite to each other. In the present embodiment, in one accumulation period, the drive signal $S_D$ is applied to the light source LS twice, and the first and second transfer signals STX1 and STX2 are applied to the first and second transfer electrodes TX1 and TX2 each time the drive signal $S_D$ is applied. By the first and second transfer signals STX1 and STX2 being respectively applied to the first and second transfer electrodes TX1 and TX2, charge transfer is carried out, and the signal charges are accumulated in the first and second signal charge-collecting regions 9a and 9b. That is, the drive signal $S_D$ and the first and second transfer signals STX1 and STX2 are applied consecutively in time series, and the collection operation (accumulation operation) of the signal charges is also carried out consecutively in time series. Then, in the readout period, the signal charges accumulated in the first and second signal charge-collecting regions 9a and 9b are read out.

The output control of the first and second transfer signals STX1 and STX2 is carried out by the controlling unit CONT. That is, in synchronization with the emission of the pulsed light Lp, the controlling unit CONT outputs the first transfer signal STX1 to the first transfer electrodes TX1 to allow the charges generated in the charge-generating region, to flow into the first signal charge-collecting regions 9a as the signal charges, and outputs the second transfer signal STX2 to the second transfer electrodes TX2 to allow the charges generated in the charge-generating region, to flow into the second signal charge-collecting regions 9b as the signal charges.

The charge quantity $Q_1$ corresponding to an overlapping period of the intensity signal SP and the first transfer signal STX1 output in synchronization with the drive signal $S_D$ at a phase difference 0 is accumulated in the first signal charge-collecting regions 9a. The charge quantity $Q_2$ corresponding to an overlapping portion of the intensity signal SP and the second transfer signal STX2 output in synchronization with the drive signal $S_D$ at a phase difference 180 is accumulated in the second signal charge-collecting regions 9b.

A phase difference $T_d$ between the intensity signal SP and a signal output in synchronization with the drive signal $S_D$ at a phase difference 0 corresponds to a flying time of light. The phase difference $T_d$ indicates the distance d from the range image sensor RS to the object OJ. The distance d is calculated by the arithmetic unit ART in accordance with the following formula (1) using a ratio between a total charge quantity $Q_{T1}$ of charge quantities $Q_1$ accumulated consecutively in time series and a total charge quantity $Q_{T2}$ of charge quantities $Q_2$. In addition, c denotes a light speed.

$$\text{Distance } d=(c/2)\times(T_p\ Q_{T2}/(Q_{T1}\ Q_{T2})) \quad (1)$$

That is, the arithmetic unit ART reads out the respective charge quantities $Q_1$ and $Q_2$ of the signal charges accumulated in the first and second signal charge-collecting regions 9a and 9b, and calculates the distance d to the object OJ based on the read out charge quantities $Q_1$ and $Q_2$. At this time, the arithmetic unit ART calculates the distance d to the object OJ based on the total charge quantities $Q_{T1}$ and $Q_{T2}$ of the signal charges accumulated consecutively in time series in the first signal charge-collecting regions 9a and the second signal charge-collecting regions 9b.

Figure 9:
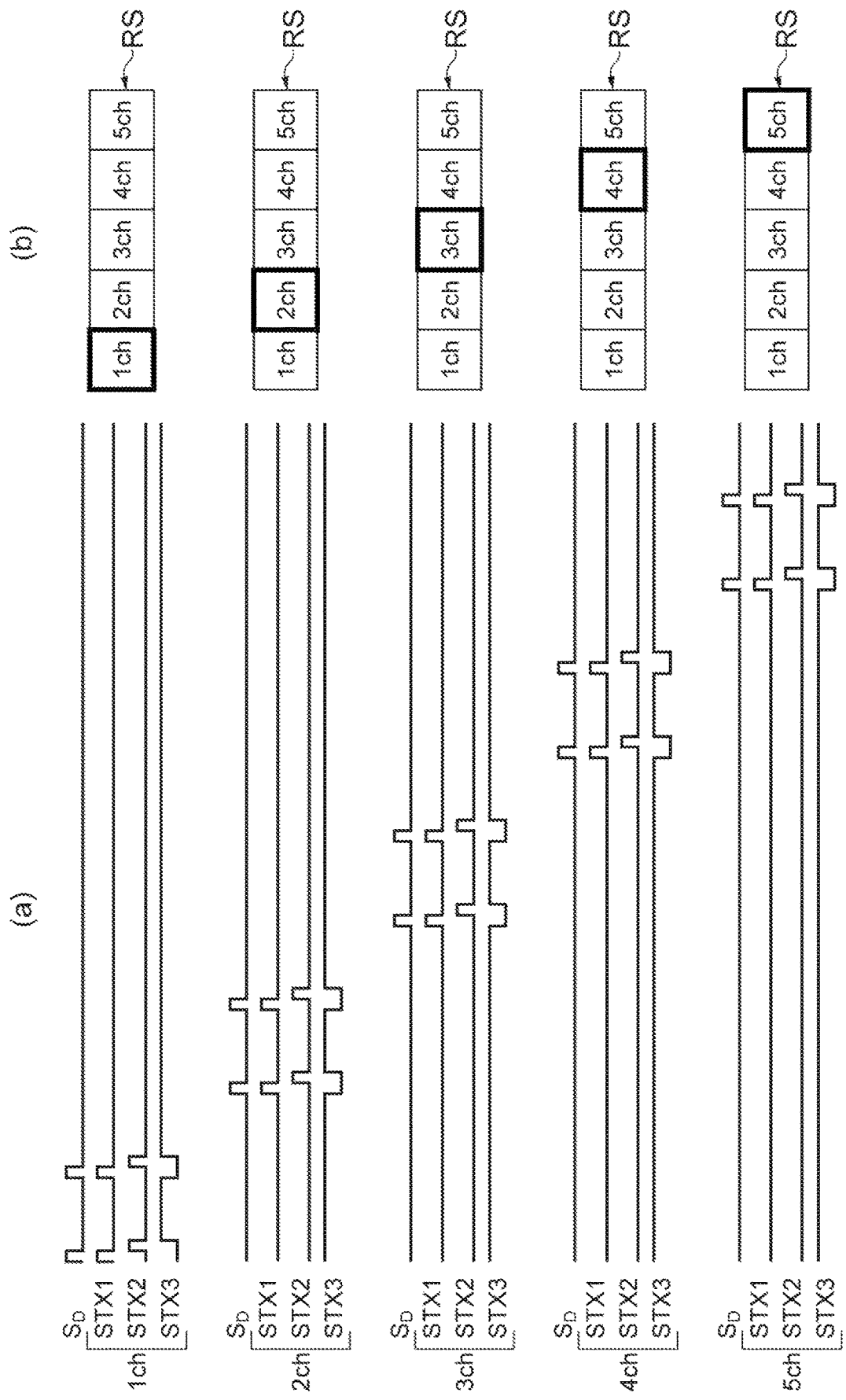
FIG. 9 is a diagram for illustrating relationship between a timing chart of various signals and a pixel to be selected.
Figure 10:
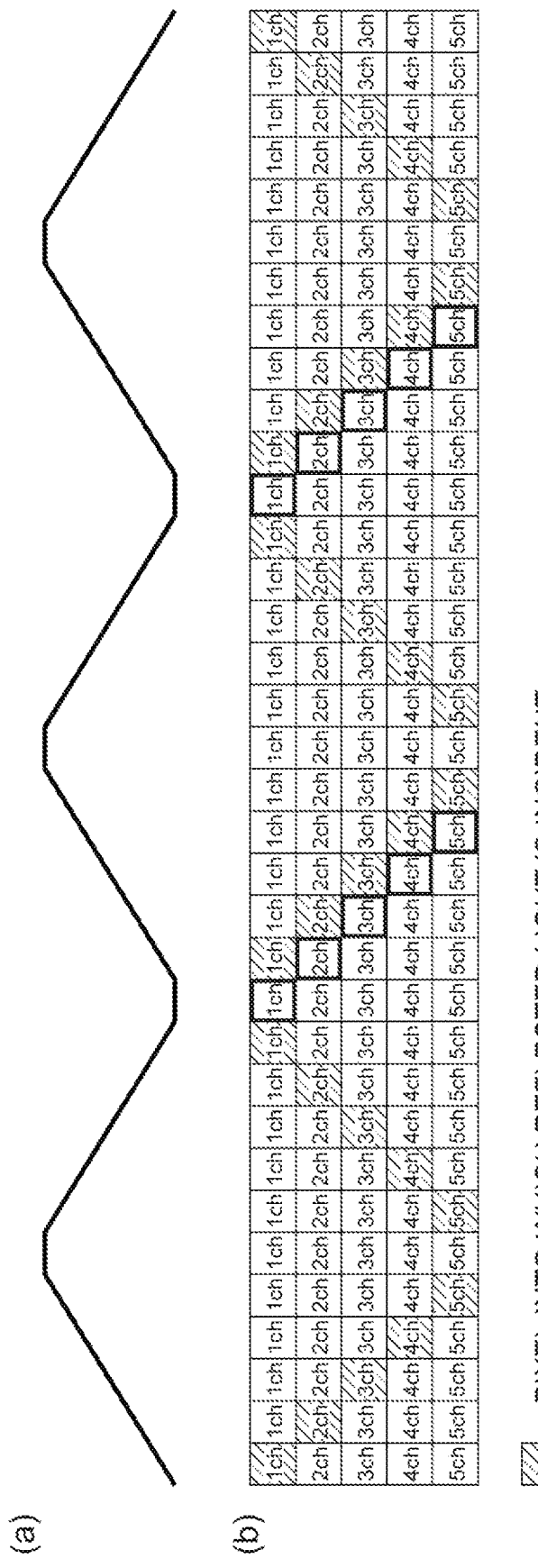
FIG. 10 is a diagram for illustrating relationship between a movement of a reflection member and a pixel.

Subsequently, a selection operation of pixels (channels: ch) constituted by the respective range sensors P will be described with reference to FIGS. 9 and 10. FIG. 9 is a diagram for illustrating relationship between a timing chart of various signals and a pixel to be selected. FIG. 10 is a diagram for illustrating relationship between a movement of a reflection member and a pixel.

In FIG. 9(a), signals applied in pixels (channels 1ch to 5ch) constituted by the respective range sensors P of the range image sensor RS, i.e., the first to third transfer signals STX1, STX2, and STX3 are illustrated together with the drive signal $S_D$. In FIG. 9(b), the range sensors P (channels 1ch to 5ch) into which the reflected light Lr is incident as a result of scanning an irradiation position on the object OJ of the pulsed light Lp are indicated as regions enclosed by bold lines. In the present embodiment, as illustrated in FIG. 10, scanning of the irradiation position on the object OJ of the pulsed light Lp is repeated in such a manner that the reflected light Lr is incident into the channels 1ch to 5ch sequentially in this order, and then, the reflected light Lr is incident into the channels 5ch to 1ch sequentially in this order.

In the present embodiment, as illustrated in FIG. 10(a), scanning of the irradiation position on the object OJ of the pulsed light Lp is repeated in such a manner that the reflected light Lr is incident into the channels 1ch to 5ch sequentially in this order, and then, the reflected light Lr is incident into the channels 5ch to 1ch sequentially in this order. FIG. 10(a) schematically illustrates the movement of the reflection member MR as a line diagram. FIG. 10(b) illustrates the range sensors P (channels 1ch to 5ch) into which the reflected light Lr is incident, in time series, as hatched regions. FIG. 10(b) illustrates range sensors P (channels 1ch to 5ch) from which the total charge quantities $Q_{T1}$ and $Q_{T2}$ are read out, in c time series, as regions enclosed by bold lines.

The pixels (channels 1ch to 5ch) into which the reflected light Lr is incident vary in accordance with the irradiation position on the object OJ of the pulsed light Lp. For example, as illustrated in FIG. 9(b), when the reflected light Lr is incident into the range sensor P constituting the pixel corresponding to the channel 1ch, the selecting unit SEL outputs the first to third transfer signals STX1, STX2, and STX3 to the range sensor P in such a manner that the above-described collection operation (accumulation operation) of the signal charges is carried out in the range sensor P constituting the pixel corresponding to the channel 1ch. For example, when the reflected light Lr is incident into the range sensor P constituting the pixel corresponding to the channel 5ch, the selecting unit SEL outputs the first to third transfer signals STX1, STX2, and STX3 to the range sensor P in such a manner that the above-described collection operation (accumulation operation) of the signal charges is carried out in the range sensor P constituting the pixel corresponding to the channel 5ch. That is, the selecting unit SEL selects, from the plurality of pixels (channels 1ch to 5ch), the pixel from which signals are to be read out, in accordance with the irradiation position on the object OJ of the pulsed light Lp.

The arithmetic unit ART reads out signals from the pixel selected by the selecting unit SEL, and calculates the distance to the object OJ for each pixel. In the present embodiment, the arithmetic unit ART collectively reads out the signal charges generated by one reciprocation of scanning, that is, the signal charges generated by the reflected light Lr being twice incident into the range sensors P constituting pixels corresponding to the respective channels 1ch to 5ch twice, and generated by the two incidences of the reflected light Lr. Thus, the arithmetic unit ART reads out two total charge quantities $Q_{T1}$ and $Q_{T2}$ in one readout period.

The selecting unit SEL outputs the first to third transfer signals STX1, STX2, and STX3 in such a manner that the above-described discharge operation of the unnecessary charges is carried out in the range sensor P constituting the pixel (channels 1ch to 5ch) into which the reflected light Lr is not incident, to the range sensor P. That is, in the range sensor P into which the reflected light Lr is not incident, the generated charges are discharged, so the charges are not accumulated.

In such manners, in the present embodiment, the selecting unit SEL (the controlling unit CONT) outputs the first transfer signal STX1 to the first transfer electrodes TX1 of the range sensor P constituting the pixel (channels 1ch to 5ch) corresponding to the irradiation position of the pulsed light Lp, to allow the signal charges to flow into the first signal charge-collecting regions 9a of the range sensor P.

The selecting unit SEL outputs the second transfer signal STX2 to the second transfer electrodes TX2 of the above-described range sensor P corresponding to the irradiation position of the pulsed light Lp, to allow the signal charges to flow into the second signal charge-collecting regions 9b of the range sensor P. That is, the charges generated in the charge-generating region (the region located below the photogate electrode PG) of the range sensor P selected by the selecting unit SEL are distributed to the first signal charge-collecting regions 9a and the second signal charge-collecting regions 9b as the signal charges, and the signal charges are collected in the corresponding regions 9a and 9b.

The selecting unit SEL (the controlling unit CONT) outputs the third transfer signal STX3 to the third transfer electrodes TX3 of the range sensor P other than the above-described range sensor P that corresponds to an irradiation position of the pulsed light Lp, to allow unnecessary charges to flow into the unnecessary charge-discharging regions 11 of the range sensor P. That is, in the range sensor P other than the range sensor P in which the signal charges are collected, the charges generated in the charge-generating region (the region positioned below the photogate electrode PG) of the range sensor P are discharged from the unnecessary charge-discharging regions 11 as unnecessary charges. The arithmetic unit ART reads out signals corresponding to the respective quantities of the signal charges collected in the first and second signal charge-collecting regions 9a and 9b of the range sensor P selected by the selecting unit SEL, and calculates the distance to the object OJ based on the ratio between the quantity of the signal charges collected in the first signal charge-collecting regions 9a and the quantity of the signal charges collected in the second signal charge-collecting regions 9b.

In view of these matters, in the range sensor P other than the range sensor P in which the signal charges are collected, the charges generated in the charge-generating region (the region positioned below the photogate electrode PG) of the range sensor P are discharged as unnecessary charges. Thus, a charge quantity that is based on unnecessary charges is difficult to be reflected in the calculation of the distance to the object OJ. Therefore, the ranging device 1 can appropriately and accurately measure the distance. According to the ranging device 1, a range image with suppressed movement distortion can be obtained even when the object OJ is a movable body.

Figure 11:
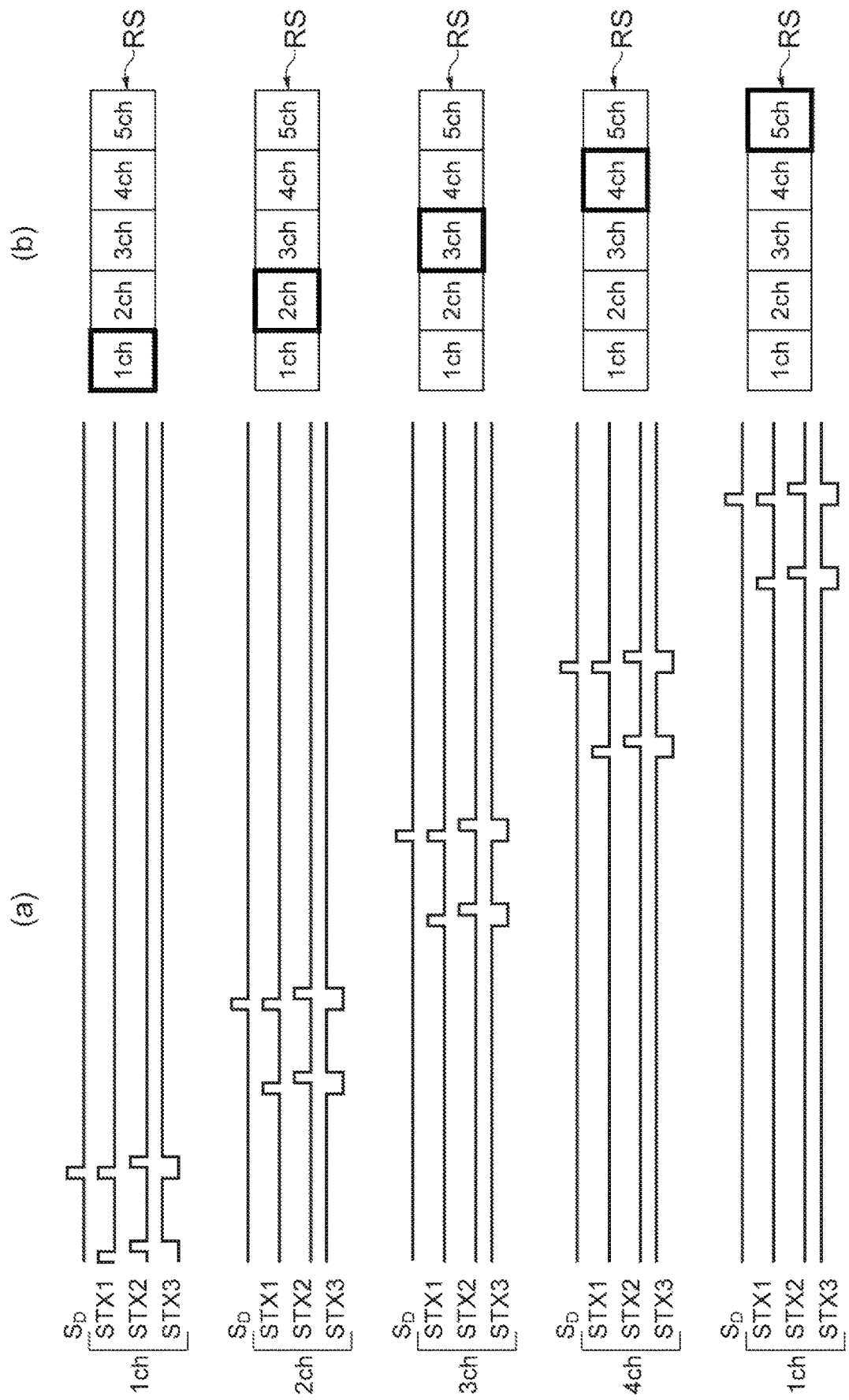
FIG. 11 is a diagram for illustrating relationship between a timing chart of various signals and a pixel to be selected, according to a modified example of the present embodiment.
Figure 12:
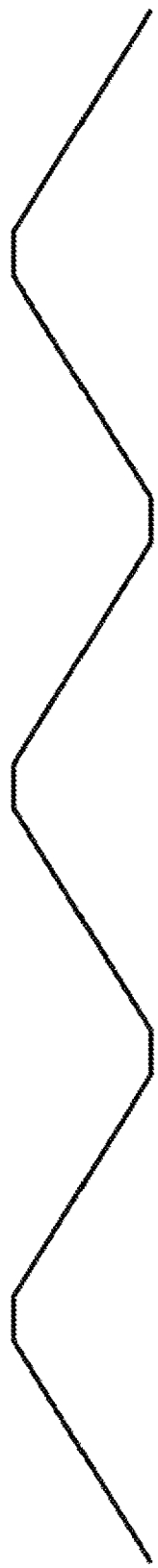
FIG. 12 is a diagram for illustrating relationship between a movement of a reflection member and a pixel according to the modified example of the present embodiment.

Next, a modified example of the present embodiment will be described with reference to FIGS. 11 and 12. FIG. 11 is a diagram for illustrating relationship between a timing chart of various signals and a pixel to be selected, according to this modified example. FIG. 12 is a diagram for illustrating relationship between a movement of a reflection member and a pixel according to this modified example.

In FIG. 11(a), similarly to FIG. 9(a), the first to third transfer signals STX1, STX2, and STX3 applied in pixels (channels 1ch to 5ch) constituted by the respective range sensors P are illustrated together with the drive signal $S_D$. In FIG. 11(b), similarly to FIG. 9(b), the range sensors P (channels 1ch to 5ch) into which the reflected light Lr is incident due to the scanning of the pulsed light Lp are indicated as regions enclosed by bold lines. Also in this modified example, as illustrated in FIG. 12, scanning of the irradiation position on the object OJ of the pulsed light Lp is repeated in such a manner that the reflected light Lr is incident into the channels 1ch to 5ch sequentially in this order, and then, the reflected light Lr is incident into the channels 5ch to 1ch sequentially in this order.

Also in this modified example, as illustrated in FIG. 12(a), scanning of the irradiation position on the object OJ of the pulsed light Lp is repeated in such a manner that the reflected light Lr is incident into the channels 1ch to 5ch sequentially in this order, and then, the reflected light Lr is incident into the channels 5ch to 1ch sequentially in this order. Similarly to FIG. 10(a), FIG. 12(a) schematically illustrates the movement of the reflection member MR as a line diagram. FIG. 12(b) illustrates the range sensors P (channels 1ch to 5ch) into which the reflected light Lr is incident, in time series, as hatched regions. FIG. 12(b) illustrates range sensors P (channels 1ch to 5ch) from which charge quantities are read out at timings at which the reflected light Lr is not incident, in time series, as regions enclosed by bold lines.

For example, as illustrated in FIG. 11(b), when the reflected light Lr is incident into the range sensor P constituting the pixel corresponding to the channel 1ch, the selecting unit SEL outputs the first to third transfer signals STX1, STX2, and STX3 to the range sensor P in such a manner that the above-described collection operation (accumulation operation) of the signal charges is carried out in the range sensor P constituting the pixel corresponding to the channel 1ch.

Precedential to the collection operation of the signal charges, at a timing at which the reflected light Lr is not incident into the range sensor P constituting the pixel corresponding to the channel 1ch, the selecting unit SEL outputs the first to third transfer signals STX1, STX2, and STX3 to the range sensor P in such a manner that the collection operation (accumulation operation) of the charges is carried out. The timing at which the reflected light Lr is not incident into the range sensor P constituting the pixel corresponding to the channel 1ch corresponds to a timing at which the pulsed light Lp is not emitted onto the irradiation position where the reflected light Lr is incident into the range sensor P. The charges collected at a timing at which the reflected light Lr is not incident are charges generated by background light or ambient light such as part of the reflected light Lr being incident into the range sensors P constituting the pixels corresponding to the other channels 2ch to 5ch, and are noise components for the signal charges.

The selecting unit SEL similarly outputs the first to third transfer signals STX1, STX2, and STX3 to corresponding range sensors P of the channels 2ch to 5ch other than the channel 1ch, to carry out the collection operation of the signal charges and the collection operation of the charges that is carried out precedential to the collection operation of the signal charges. The charges collected by the collection operation precedential to the collection operation of the signal charges are collected into the first signal charge-collecting regions 9a and the second signal charge-collecting regions 9b similarly to the signal charges. Timings at which the reflected light Lr is incident into the range sensors P constituting the pixels corresponding to the respective channels 1ch to 5ch are timings different from a timing at which the signal charges are allowed to flow into the first and second signal charge-collecting regions 9a and 9b.

The arithmetic unit ART reads out signals from the pixel selected by the selecting unit SEL, and calculates the distance to the object OJ for each pixel. In this modified example, the arithmetic unit ART reads out, for each of the range sensors P constituting the pixels corresponding to the respective channels 1ch to 5ch, charge quantities $Q_1$ and $Q_2$ that are based on the collection operation of signal charges, and charge quantities that are based on the collection opera-tion of charges that is carried out precedential to the collection operation of signal charges. The arithmetic unit ART calculates the distance to the object OJ based on a ratio between a charge quantity $(Q_1-q_1)$ obtained by subtracting a charge quantity $q_1$ collected in the first signal charge-collecting regions 9a by the collection operation of the charges that is carried out precedential to the collection operation of the signal charges, from the charge quantity $Q_1$ that is based on the collection operation of the signal charges, and a charge quantity $(Q_2-q_2)$ obtained by subtracting a charge quantity $q_2$ collected in the second signal charge-collecting regions 9b by the collection operation of the charges that is carried out precedential to the collection operation of the signal charges, from the charge quantity $Q_2$ that is based on the collection operation of the signal charges.

Also in this modified example, the selecting unit SEL outputs the first to third transfer signals STX1, STX2, and STX3 in such a manner that the above-described discharge operation of unnecessary charges is carried out in range sensors P excluding the range sensor P earring out the above-described collection operation of charges precedential to the collection operation of signal charges, from range sensors P constituting pixels (channels 1ch to 5ch) into which the reflected light Lr is not incident, to the range sensors P. That is, in the range sensors P into which the reflected light Lr is not incident, and that do not carry out the collection operation of the charges precedential to the collection operation of the signal charges, generated the charges are discharged, so the charges are not accumulated.

In such manners, in this modified example, in the selected range sensor P, the selecting unit SEL (the controlling unit CONT) outputs the first transfer signal STX1 to the first transfer electrodes TX1 of the range sensor P to allow the charges to flow into the first signal charge-collecting regions 9a, precedential to the inflow of the signal charges into the first and second signal charge-collecting regions 9a and 9b, at the timing at which the pulsed light Lp is not emitted from the light source LS. In the above-described selected range sensor P, the selecting unit SEL outputs the second transfer signal STX2 to the second transfer electrodes TX2 of the range sensor P to allow the charges to flow into the second signal charge-collecting regions 9b, precedential to the inflow of the signal charges into the first and second signal charge-collecting regions 9a and 9b, at the timing at which the pulsed light Lp is not emitted from the light source LS. That is, in the charge-generating region (the region located below the photogate electrode PG) of the range sensor P selected by the selecting unit SEL, the charges generated not by the emission of the pulsed light Lp corresponding to the range sensor P are distributed to the first signal charge-collecting regions 9a and the second signal charge-collecting regions 9b, and are collected in the corresponding regions 9a and 9b.

The arithmetic unit ART calculates a distance to the object OJ based on a ratio between a quantity $(Q_1-q_1)$ of signal charges collected in the first signal charge-collecting regions 9a that is obtained by subtracting a quantity $q_1$ of charges collected in the first signal charge-collecting regions 9a at a timing at which the pulsed light Lp is not emitted from the light source LS, and a quantity $(Q_2-q_2)$ of signal charges collected in the second signal charge-collecting regions 9b that is obtained by subtracting a quantity $q_2$ of charges collected in the second signal charge-collecting regions 9b at a timing at which the pulsed light Lp is not emitted from the light source LS. In other words, by subtracting charges generated not by the emission of the pulsed light Lp corresponding to the selected range sensor P, a charge quantity that is based on the above-described ambient light is difficult to be reflected in the calculation of the distance to the object OJ. Thus, in this modified example, distance measurement can be carried out more appropriately and accurately.

The embodiment of the present invention and the modified example of the embodiment have been described above. The present invention, however, is not necessarily limited to the above-described embodiment, and various changes can be made without departing from the scope of the present invention.

For example, in the above-described embodiment and the modified example, each range sensor P includes pairs of first signal charge-collecting regions 9a, second signal charge-collecting regions 9b, unnecessary charge-discharging regions 11, first transfer electrodes TX1, second transfer electrodes TX2, and third transfer electrodes TX3. Nevertheless, the numbers of first signal charge-collecting regions 9a, second signal charge-collecting regions 9b, unnecessary charge-discharging regions 11, and first to third transfer electrodes TX1, TX2, and TX3 included in each range sensor P are not limited to these. The numbers of first signal charge-collecting regions 9a, second signal charge-collecting regions 9b, unnecessary charge-discharging regions 11, and first to third transfer electrodes TX1, TX2, and TX3 included in each range sensor P may be one, or three or more. The number of range sensors P included in the range image sensor RS is not limited to five, and is only required to be plural. In the present embodiment and this modified example, the number of pixels (range sensors P) that is selected by the selecting unit SEL is one. Nevertheless, the number may be two or more.

In the present embodiment and this modified example, the light path of the pulsed light Lp emitted from the light source LS is changed using the reflection member MR, and the irradiation position on the object OJ of the pulsed light Lp is scanned. Nevertheless, the configuration is not limited to this. The irradiation position on the object OJ of the pulsed light Lp may be scanned by moving the light source LS without using the reflection member MR.

In this modified example, the selecting unit SEL (the controlling unit CONT) outputs the first and second transfer signals STX1 and STX2 to allow the charges to flow into the first and second signal charge-collecting regions 9a and 9b, precedential to the inflow of the signal charges into the first and second signal charge-collecting regions 9a and 9b, at the timing at which the pulsed light Lp is not emitted from the light source LS. Nevertheless, the configuration is not limited to this. The selecting unit SEL (the controlling unit CONT) may output the first and second transfer signals STX1 and STX2 to allow the charges to flow into the first and second signal charge-collecting regions 9a and 9b, subsequent to the inflow of the signal charges into the first and second signal charge-collecting regions 9a and 9b, and at the timing at which the pulsed light Lp is not emitted from the light source LS.

In the present embodiment, in each range sensor P, the quantity of the charges collected by two collection operations (accumulation operations) continuous in time series is read out. Nevertheless, the configuration is not limited to this. In each range sensor P, the quantity of the charges collected by three or more collection operations (accumulation operations) continuous in time series may be read out. In this manner, the quantity of collected charges also increases in accordance with the increase in the number of collection operations, so that a sufficient signal quantity is ensured. As a matter of course, the sufficient signal quantity is ensured by the quantity of charges collected in two collection operations.

The range image sensor RS is not limited to a line sensor in which the plurality of range sensors P is one-dimensionally arrayed. The range image sensor RS may be a line sensor in which the plurality of range sensors P is two-dimensionally arrayed. In this case, a two-dimensional image can be easily obtained.

The range image sensor RS is not limited to a front-illuminated range image sensor. The range image sensor RS may be a back-illuminated range image sensor.

A charge-generating region that generates the charges in accordance with incident light may include a photodiode (e.g., an embedded photodiode).

The p-type and n-type of conductive types in the range image sensor RS according to the present embodiment may be replaced by each other to be inversed to those in the above description.

INDUSTRIAL APPLICABILITY

The present invention can be used in a ranging device for measuring a distance to a object.

REFERENCE SIGNS LIST

1: ranging device, 9a: first signal charge-collecting region, 9b: second signal charge-collecting region, 11: unnecessary charge-discharging region, A: one-dimensional direction, ART: arithmetic unit, CONT: controlling unit, DRY: driving unit, Lp: pulsed light, Lr: reflected light, LS: light source, MR: reflection member, OJ: object, P: range sensor, PG: photogate electrode, Pi: irradiation position, RS: range image sensor, SEL: selecting unit, STX1: first transfer signal, STX2: second transfer signal, STX3: third transfer signal, TX1: first transfer electrode, TX2: second transfer electrode, TX3: third transfer electrode.

The invention claimed is:

1. A ranging device comprising:
a scanning unit scanning an irradiation position on an object of pulsed light emitted from a light source;
a light receiving unit including a plurality of pixels arrayed in a one-dimensional direction, and into which reflected light of the pulsed light reflected off the object is incident;
a selecting unit selecting, from the plurality of pixels, a pixel from which a signal is to be read out, in accordance with the irradiation position of the pulsed light scanned by the scanning unit; and
an arithmetic unit reading out a signal from the pixel selected by the selecting unit, and calculating a distance to the object,
wherein each of the plurality of pixels includes:
a charge-generating region generating charges in accordance with incident light;
first and second signal charge-collecting regions disposed away from the charge-generating region, and collecting the charges generated in the charge-generating region, as signal charges;
an unnecessary charge-discharging region disposed away from the charge-generating region, and discharging the charges generated in the charge-generating region, as unnecessary charges;
a first transfer electrode disposed between the first signal charge-collecting region and the charge-generating region, and allowing the charges generated in the charge-generating region to flow into the first signal charge-collecting region as the signal charges in accordance with a first transfer signal;
a second transfer electrode disposed between the second signal charge-collecting region and the charge-generating region, and allowing the charges generated in the charge-generating region to flow into the second signal charge-collecting region as the signal charges in accordance with a second transfer signal different in phase from the first transfer signal; and
a third transfer electrode disposed between the unnecessary charge-discharging region and the charge-generating region, and allowing the charges generated in the charge-generating region to flow into the unnecessary charge-discharging region as the unnecessary charges in accordance with a third transfer signal different in phase from the first and second transfer signals,
wherein, in accordance with an irradiation position of the pulsed light scanned by the scanning unit, the selecting unit outputs the first transfer signal to the first transfer electrode and outputs the second transfer signal to the second transfer electrode, to allow the signal charges to flow into the first and second signal charge-collecting regions of the pixel corresponding to the irradiation position, from among the plurality of pixels, and outputs the third transfer signal to the third transfer electrode to allow the unnecessary charges to flow into the unnecessary charge-discharging region of the pixel other than the pixel corresponding to the irradiation position, from among the plurality of pixels,
wherein the arithmetic unit reads out a first quantity of the signal charges from the first signal charge-collecting region and a second quantity of the signal charges from the second signal charge-collecting region of the pixel selected by the selecting unit, and calculates a distance to the object based on a ratio between the first quantity and the second quantity,
wherein while the scanning unit scans the irradiation position of the pulsed light a plurality of times such that the reflected light of the pulsed light is incident on each pixel a plurality of times the selecting unit controls the first, second, and third transfer electrodes such that the first and second signal charge-collecting regions accumulate the signal charges, and
wherein the arithmetic unit reads out the charges accumulated by the plurality of scan from the first and second charge-collecting regions.

2. The ranging device according to claim 1,
wherein, in the selected pixel, the selecting unit outputs the first transfer signal to the first transfer electrode and outputs the second transfer signal to the second transfer electrode, to allow charges flow into the first and second signal charge-collecting region, at a timing different from a timing at which the signal charges are allowed to flow into the first and second signal charge-collecting regions, and at a timing at which the pulsed light is not emitted from the light source, and
wherein a first background noise is subtracted from the first quantity and a second background noise is subtracted from the second quantity prior to calculating the ratio, the first background noise corresponding to a third quantity of signal charges collected in the first signal charge-collecting region at the timing at which the pulsed light is not emitted from the light source, and the second background noise corresponding to a fourth quantity of signal charges collected in the second signal charge-collecting region at the timing at which the pulsed light is not emitted from the light source.

* * * * *